United States Patent
Tsujihashi et al.

[11] Patent Number: 6,121,644
[45] Date of Patent: Sep. 19, 2000

[54] SEMICONDUCTOR INTEGRATED CIRCUIT DEVICE AND METHOD OF ARRANGING AND WIRING CELLS

[75] Inventors: Yoshiki Tsujihashi; Hisashi Matsumoto; Kazuhiro Yamazaki, all of Itami, Japan

[73] Assignee: Mitsubishi Denki Kabushiki Kaisha, Tokyo, Japan

[21] Appl. No.: 08/094,925

[22] Filed: Jul. 22, 1993

Related U.S. Application Data

[63] Continuation of application No. 07/730,679, Jul. 16, 1991, abandoned.

[30] Foreign Application Priority Data

Jul. 27, 1990 [JP] Japan ..................................... 2-199568
Jul. 1, 1991 [JP] Japan ..................................... 3-160235

[51] Int. Cl.⁷ ................................................. H01L 27/10
[52] U.S. Cl. .......................................... 257/207; 257/210
[58] Field of Search ................................. 357/42, 45, 68; 257/202–211

[56] References Cited

U.S. PATENT DOCUMENTS

| | | | |
|---|---|---|---|
| 4,249,193 | 2/1981 | Balyoz et al. | 357/45 |
| 4,623,911 | 11/1986 | Pryor | 357/45 |
| 4,651,190 | 3/1987 | Suzuki et al. | 357/45 |
| 4,716,450 | 12/1987 | Hashishita | 357/45 |

FOREIGN PATENT DOCUMENTS

| | | |
|---|---|---|
| 0 001 209 | 4/1979 | European Pat. Off. . |
| 3 423 211 | 1/1985 | Germany . |

OTHER PUBLICATIONS

"New Design Approach for Configurable Data–Path", Proceedings of the IEEE CICC, pp. 14.5.1–14.5.4, 1990.

*Primary Examiner*—David Hardy
*Attorney, Agent, or Firm*—Oblon, Spivak, McClelland, Maier & Neustadt, P.C.

[57] ABSTRACT

Input/output terminals 10 made of a first aluminium wiring layer are provided within cells 3a to 3c in the same cell row 30. A plurality of mains 7a to 7c made of a second aluminium wiring layer, which are electrically independent of the input/output terminals 10 of the standard cells 3a to 3c, a power source wire 1 and a grounding wire 2, are arranged between the input/output terminals 10 of the standard cells 3 to be connected so that they extend in parallel with a cell row extending direction. Via holes 8 are provided in regions in which the input/output terminals 10 overlap the mains 7 two-dimensionally to make electrical connection between the input/output terminals 10 and the mains 7. Since the wirings in the same cell row are executed within the cells in the cell row, an integration degree can be improved.

9 Claims, 12 Drawing Sheets

SEMICONDUCTOR INTEGRATED CIRCUIT DEVICE AND METHOD OF ARRANGING AND WIRING CELLS

This application is a Continuation of application Ser. No. 07/730,679, filed on Jul. 16, 1991, now abandoned.

BACKGROUND OF THE INVENTION

1. Field of the Invention

The present invention relates to a method of arranging and wiring cells having logical functions and to a semiconductor integrated circuit device based on the method.

2. Description of the Background Art

Standard cells have been prepared in advance on condition that the basic components needed for system design are standardized such as gates, flip-flops, functional blocks and that the layout design thereof is automated. Normally, the standard cells are defined by semiconductor-makers and are open to common users.

Figure 12:
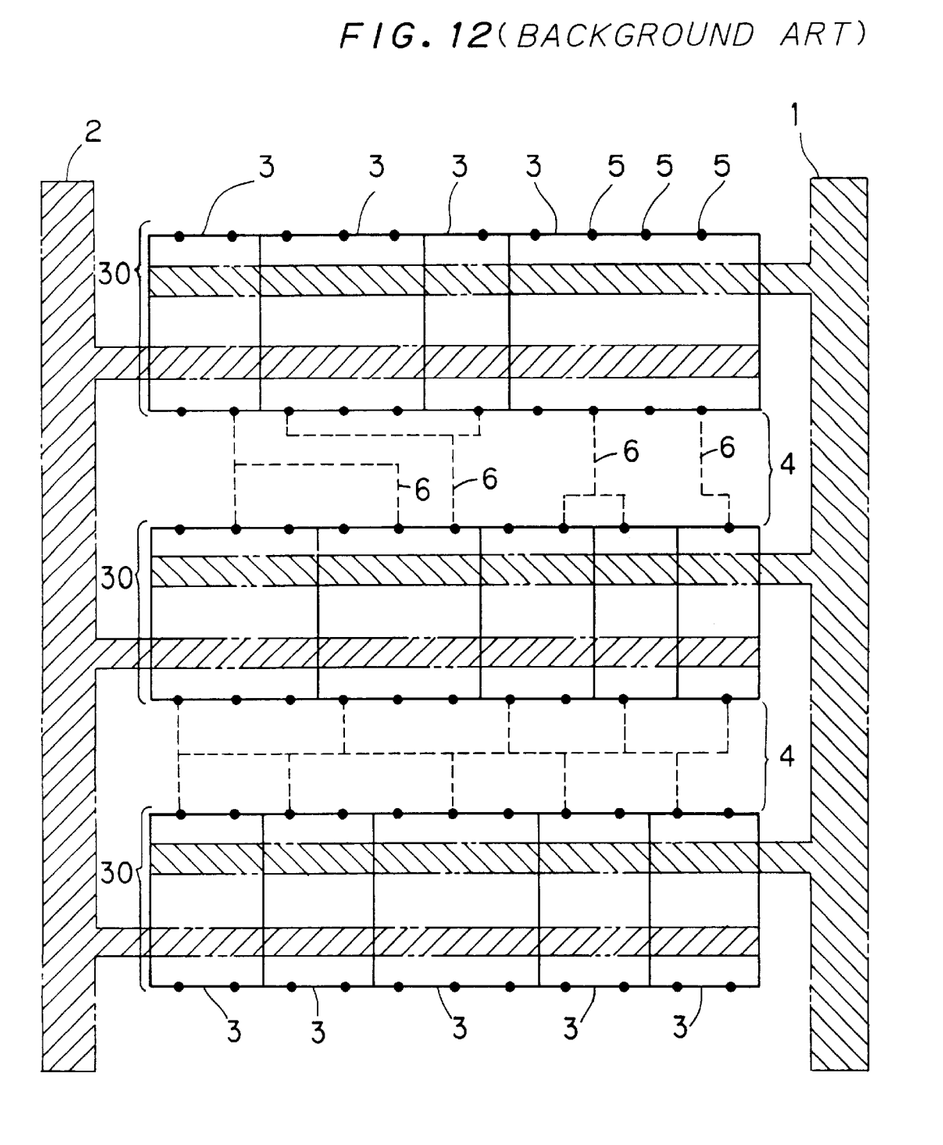
FIG. 12 is a plan view of the layout of a conventional semiconductor integrated circuit device in the standard cell system.

FIG. 12 is a plan view of the layout of a conventional integrated circuit in accordance with a standard cell system. Reference numeral 1 designates a power source wire, and 2 designates a grounding wire. There are provided cell rows 30 each including a plurality of standard cells 3 arranged in a predetermined direction (laterally in FIG. 12). Devices in the same standard cell 3 are connected to each other within the cell (as is not shown). Connection between the cells 3 is made such that an intercell signal wiring 6 (shown by the dotted lines of FIG. 12) is formed in an intercell signal wiring exclusive region 4 provided between the cell rows 30 to connect input/output terminals 5 (shown by the closed circles of FIG. 12) mounted in the respective standard cells 3 to each other through the intercell signal wiring 6.

In the conventional method of arranging and wiring cells in accordance with the standard cell system, all of the intercell signal wirings 6 are achieved by the use of the intercell signal wiring exclusive region 4 provided on the outside of the cells. Hence, there has been a problem that a semiconductor integrated circuit device produced by the conventional method in accordance with the standard cell system cannot be improved in an integration degree.

SUMMARY OF THE INVENTION

The present invention is intended for a semiconductor integrated circuit device in a standard cell system, in which a plurality of standard cells each having a logical function are arranged to make an external connection between the standard cells by forming intercell connection wirings between the cells to be connected. According to the present invention, the semiconductor integrated circuit device comprises providing at least one of the intercell connection wirings in an internal region of at least one of the standard cells.

The present invention is also intended for a method of arranging and wiring cells. According to the present invention, the method comprises the steps of arranging a plurality of standard cells each having a logical function and including an input/output terminal adjacent to each other in a predetermined direction to form a cell row, providing a cell row wiring layer extending in the cell row in the predetermined direction, the cell row wiring layer being electrically independent of all of the standard cells included in the cell row, and selecting connection input/output terminals which are included in respectively different standard cells and are desired to be electrically connected to each other from the input/output terminals included in the plurality of standard cells, and making electrical connection between the connection input/output terminals and the cell row wiring layer, so that external wiring is made between the connection input/output terminals in the same cell row.

The present invention is also intended for a semiconductor integrated circuit device produced by the above-mentioned method.

The semiconductor integrated circuit device according to the present invention is provided with at least one of the intercell connection wirings in the internal region of at least one of the standard cells. Accordingly, the area of the intercell signal wiring exclusive region formed on the outside of the standard cells can be reduced, so that an integration degree can be improved.

In the method of arranging and wiring cells and the semiconductor integrated circuit device produced by the method according to the present invention, the external wiring between the standard cells in the same cell row can be achieved by electrically connecting the cell row wiring layer to the input/output terminals of the standard cells to be connected. All of the external wirings in the same cell row can be made in the cell row. Accordingly, the area of the intercell signal wiring exclusive region formed on the outside of the standard cells can be reduced, so that the integration degree can be improved.

An object of the present invention is to provide a method of arranging and wiring cells, which is capable of forming a semiconductor integrated circuit device having a high integration degree in accordance with a standard cell system.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
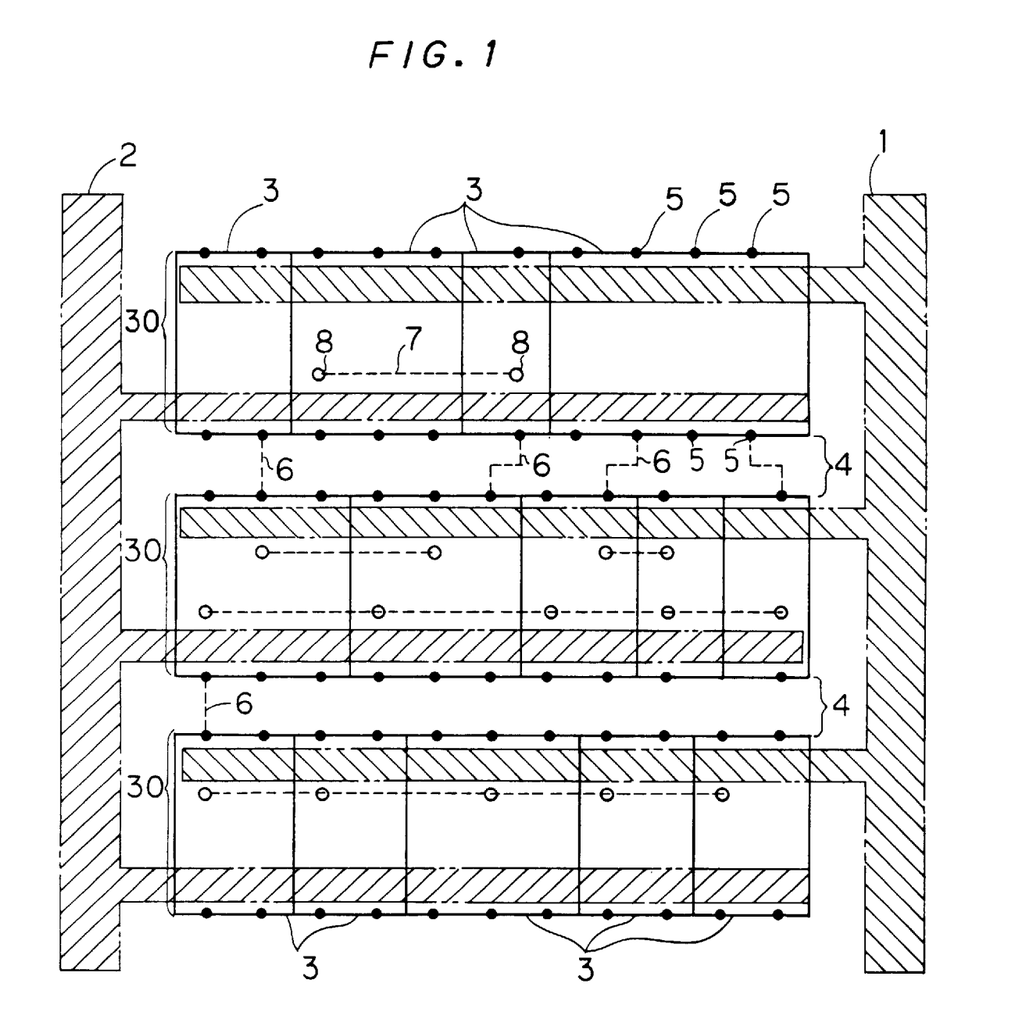
FIG. 1 is a plan view of the layout of a semiconductor integrated circuit device in a standard cell system according to a first preferred embodiment of the present invention.

FIG. 1 is a plan view of the layout of a semiconductor integrated circuit device in accordance with a standard cell system according to a first preferred embodiment of the present invention. Reference numeral 1 designates a power source wire, and 2 designates a grounding wire. There are provided cell rows 30 each including a plurality of standard cells 3 arranged in a predetermined direction (laterally in FIG. 1).

Devices in the same standard cell 3 are connected to each other within the cell (as is not shown in FIG. 1). Connection between the cells 3 in different cell rows 30 is made such that an intercell signal wiring 6 (shown by the dotted lines of FIG. 1) is formed in an intercell signal wiring exclusive region 4 provided between the cell rows 30 to wire input/output terminals 5 (shown by the closed circles of FIG. 1) mounted in the respective standard cells 3 to each other. Connection between the cells in the same cell row 30 is made by connecting a main 7 as a cell row wiring layer in the standard cells 3 to objective input/output terminals through via holes 8.

Figure 2:
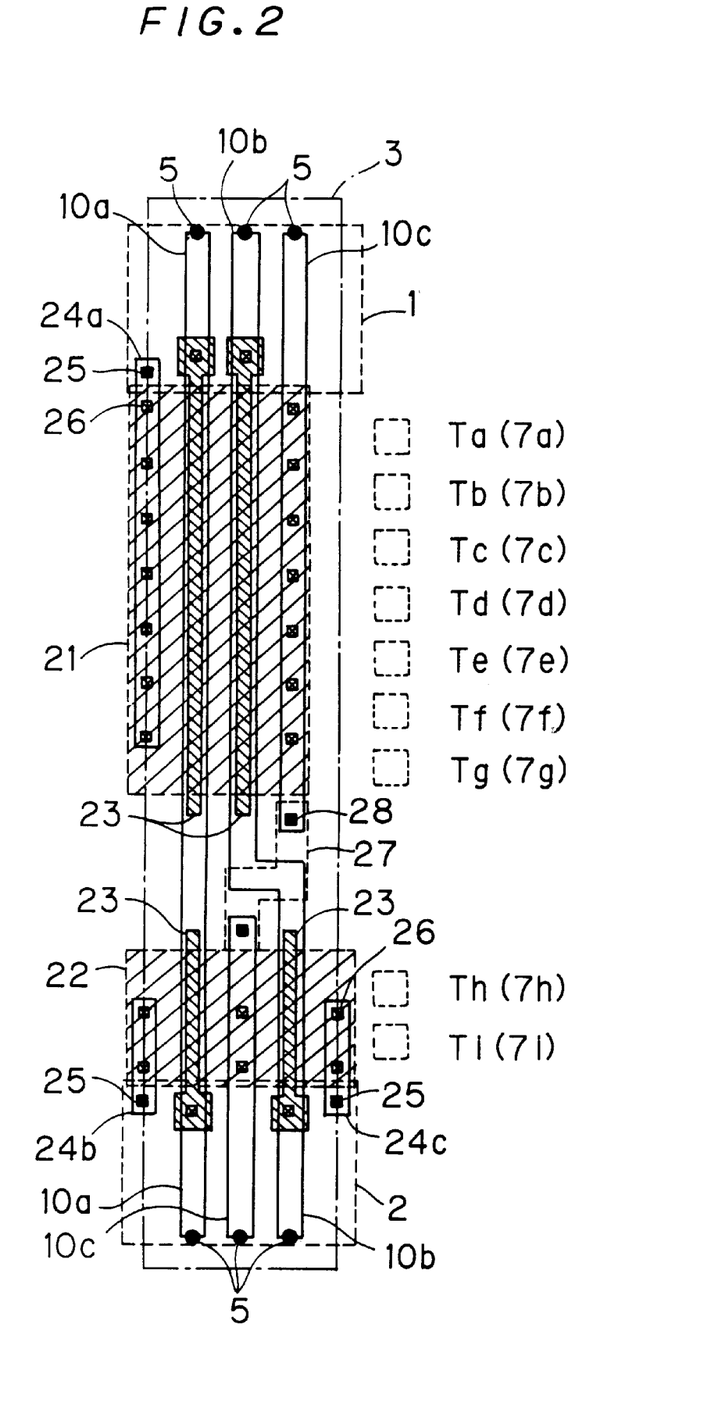
FIG. 2 is a plan view showing the internal structure of a standard cell 3 shown in FIG. 1 in detail.

FIG. 2 is a plan view showing the internal structure of the standard cell 3 shown in FIG. 1 in detail. The power source wire 1 and the grounding wire 2 are formed of a second aluminium wiring layer which is provided above a first aluminium wiring layer. A P diffusion region 21 and an N diffusion region 22 are formed between the power source wire 1 and the grounding wire 2. Polysilicon layers 23 which are different from the first and second aluminium wiring layers are formed above the P and N diffusion regions 21 and 22, so that two P channel transistors and two N channel transistors are formed.

Three input/output terminals 10a to 10c are formed which are made of the first aluminium wiring layer and extend from the vicinity of the power source wire 1 to the vicinity of the grounding wire 2. The input/output terminal 10c is separated into two portions, that is, a portion on the side of the P diffusion region 21 and a portion on the side of the N diffusion region 22. An internal wiring layer 27 made of the second aluminium wiring layer is provided between the two portions. The internal wiring layer 27 is electrically connected to the input/output terminal 10c through via holes 28, whereby electrical connection is made between the two portions of the input/output terminal 10c. For convenience, the input/output terminals 5 are shown on the top and bottom ends of the standard cells 3 in FIG. 1.

Figure 3:
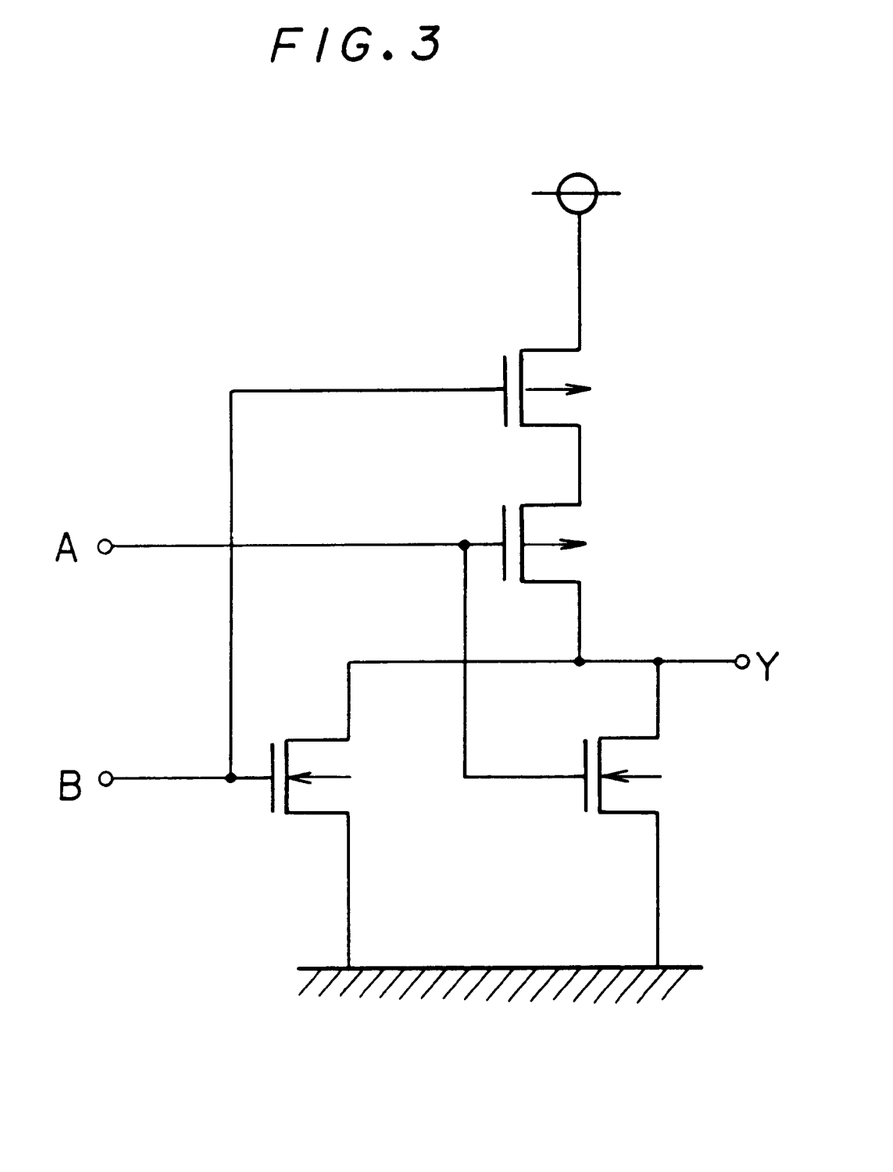
FIG. 3 is an equivalent circuit diagram showing the function of the standard cell 3 of FIG. 2.

Internal wiring layers 24a to 24c made of the first aluminium wiring layer and via holes 25 are formed to make electrical connection between the power source wire 1 and the internal wiring layer 24a and electrical connection between the grounding wire 2 and the internal wiring layers 24b, 24c. The provision of via holes 26 permits electrical connection to be made between the input/output terminal 10 or the internal wiring layers 24a to 24c and the diffusion regions 21, 22 or the polysilicon layer 23. Thus, a two-input NOR gate is structured in which the input/output terminals 10a and 10b are input terminals A and B respectively and the input/output terminal 10c is an output terminal Y, as shown in the equivalent circuit of FIG. 3.

In relation to the standard cell 3 having such a structure, tracks Ta to Ti are assumed in parallel between the power source wire 1 and the grounding wire 2. The tracks Ta to Ti are virtual regions on which mains 7a to 7i made of the second aluminium wiring layer can be formed. However, no virtual tracks T are assumed in a region, between the P diffusion region 21 and the N diffusion region 22, in which the internal wiring layer 27 made of the second aluminium wiring layer is formed. This is because the main 7 made of the same aluminium wiring layer cannot be formed in the region.

The via hole is formed in a region in which the input/output terminal 10 of the standard cell 3 overlaps the virtual track T two-dimensionally, whereby electrical connection is made between the input/output terminal 10 of the standard cell 3 and the main 7. As a result, all of the connections between the input/output terminals of the different standard cells in the same cell row can be made by the mains 7 formed within the cell row. The wiring between the standard cells in different cell rows can be made by using the first aluminium wiring layer.

Thus, the input/output terminals 10 of the respective standard cells 3 and the main 7, which are made of the different aluminium layers, are arranged so that they do not fail to overlap two-dimensionally within the standard cells 3. The via holes are formed in the regions in which the input/output terminals 10 overlap the main 7. This affords the wiring between the standard cells 3 in the same cell row 30. As a result, all of the intercell wirings in the same cell row 30 can be made within the cell row 30. Accordingly, the area of the intercell signal wiring exclusive region 4 formed on the outside of the cells can be reduced to improve an integration degree.

Figure 4:
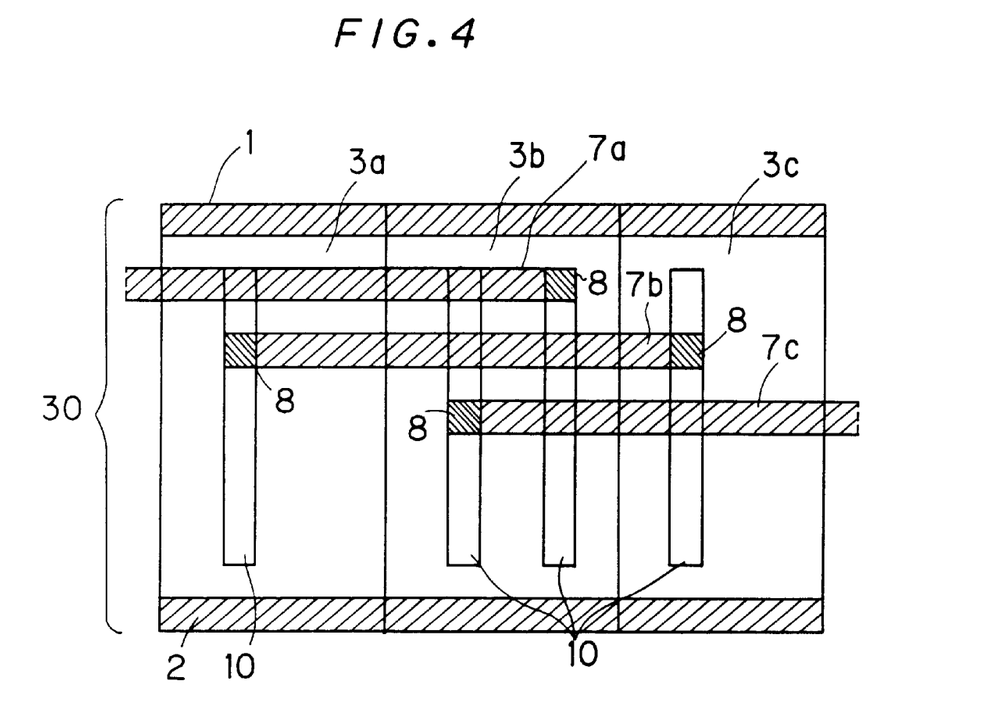
FIGS. 4 and 5 typically illustrate intercell connections in the same cell row in the semiconductor integrated circuit device in the standard cell system according to a second preferred embodiment of the present invention, respectively.

FIG. 4 typically illustrates intercell connection in the same cell row in the semiconductor integrated circuit device in accordance with the standard cell system according to a second preferred embodiment of the present invention. The power source wire 1 is disposed on the top of the standard cells 3, and the grounding wire 2 is disposed on the bottom thereof. The input/output terminals 10 made of the first aluminium wiring layer are arranged within the respective cells 3a to 3c in the same cell row 30 so that they extend perpendicularly to a cell row extending direction from the vicinity of the power source wire 1 to the vicinity of the grounding wire 2. A plurality of mutually independent mains 7a to 7c are arranged between the input/output terminals 10 of the objective standard cells 3 so that they extend in parallel with the cell row extending direction. The mains 7a to 7c are made of the second aluminium wiring layer formed above the first aluminium wiring layer and are electrically independent of the input/output terminals 10 of the standard cells 3, the power source wire 1 and the grounding wire 2. The power source wire 1 and the grounding wire 2 are formed of the second aluminium wiring layer.

Figure 5:
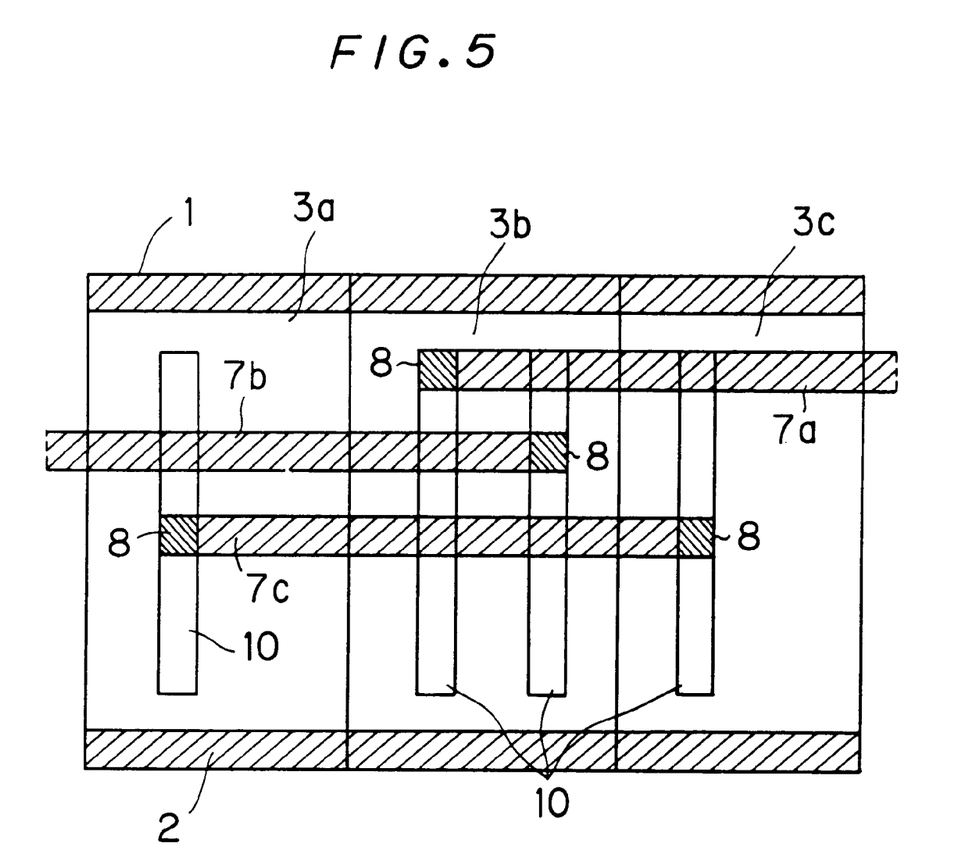

The via holes 8 are formed in the regions in which the input/output terminals 10 and the mains 7 overlap two-dimensionally to make electrical connection between the input/output terminals 10 and the mains 7. For example, the main 7b is electrically connected to the input/output terminal 10 of the standard cell 3a and to the input/output terminal 10 of the standard cell 3c through the via holes 8 respectively, thereby the intercell connection being made between the standard cells 3a and 3c. FIG. 5 shows an example of the intercell connection between the standard cells 3a and 3c by electrically connecting the main 7c to the input/output terminal 10 of the standard cell 3a and to the input/output terminal 10 of the standard cell 3c through the via holes 8 respectively.

Figure 6:
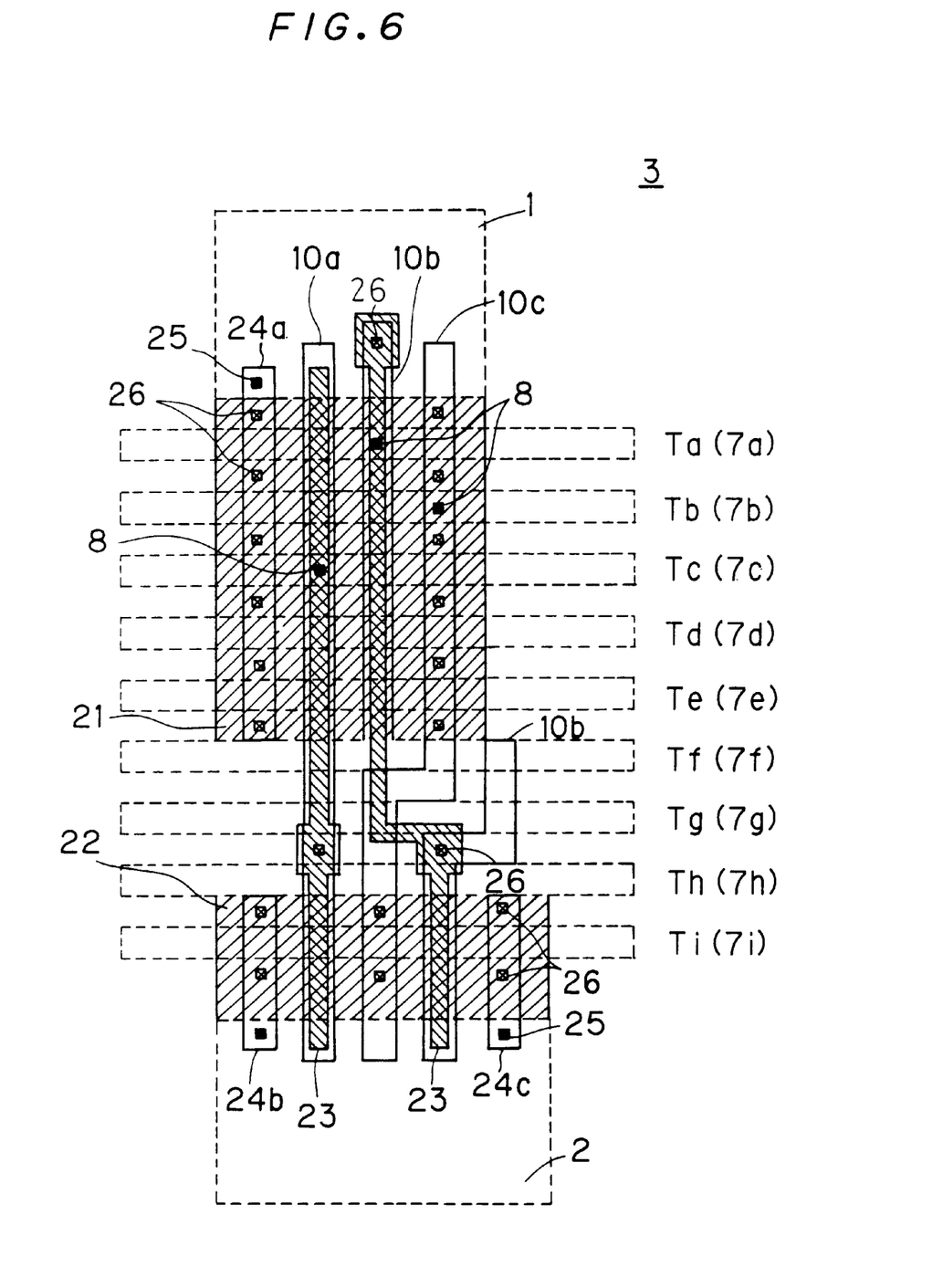
FIG. 6 is a plan view showing the internal structure of the standard cell 3 in detail according to the second preferred embodiment.

FIG. 6 is a plan view showing the internal structure of the standard cell 3 in detail according to the second preferred embodiment. Two polysilicon layers 23 which are different from the first and second aluminium wiring layers are formed above the P and N diffusion regions 21 and 22 provided between the power source and grounding wires 1 and 2 made of the second aluminium wiring layer, so that two P channel transistors and two N channel transistors are formed.

Three input/output terminals 10a to 10c made of the first aluminium wiring layer are formed from the vicinity of the power source wire 1 to the vicinity of the grounding wire 2. The input/output terminal 10b is separated into two portions, that is, a portion above the P diffusion region 21 and a portion above the remaining region. The two portions are electrically connected to each other through the polysilicon layers 23 and the via holes 26.

The internal wiring layers 24a to 24c made of the first aluminium wiring layer and the via holes 25 are formed to make electrical connection between the power source wire 1 and the internal wiring layer 24a and electrical connection between the grounding wire 2 and the internal wiring layers 24b, 24c. The provision of the via holes 26 permits electrical connection to be made between the input/output terminal 10 or the internal wiring layers 24a to 24c and the diffusion regions 21, 22 or the polysilicon layers 23. The two-input NOR gate is structured in which the input/output terminals 10a and 10b are input terminals A and B respectively and the input/output terminal 10c is an output terminal Y, as shown in the equivalent circuit of FIG. 3.

In relation to the standard cell 3 having such a structure, the tracks Ta to Ti are assumed in parallel between the power source wire 1 and the grounding wire 2. The tracks Ta to Ti are the virtual regions on which the mains 7a to 7i made of the second aluminium wiring layer can be formed. The via hole 8 is formed in the region in which the input/output terminal 10 of the standard cell 3 overlaps the selected track T two-dimensionally, whereby electrical connection can be made between the input/output terminal 10 of the standard cell 3 and the main 7 formed on the selected track T. In the example of FIG. 6, electrical connections between the input/output terminal 10a and the main 7c, between the input/output terminal 10b and the main 7a and between the input/output terminal 10c and the main 7b are made through the via holes 8.

Figure 7:
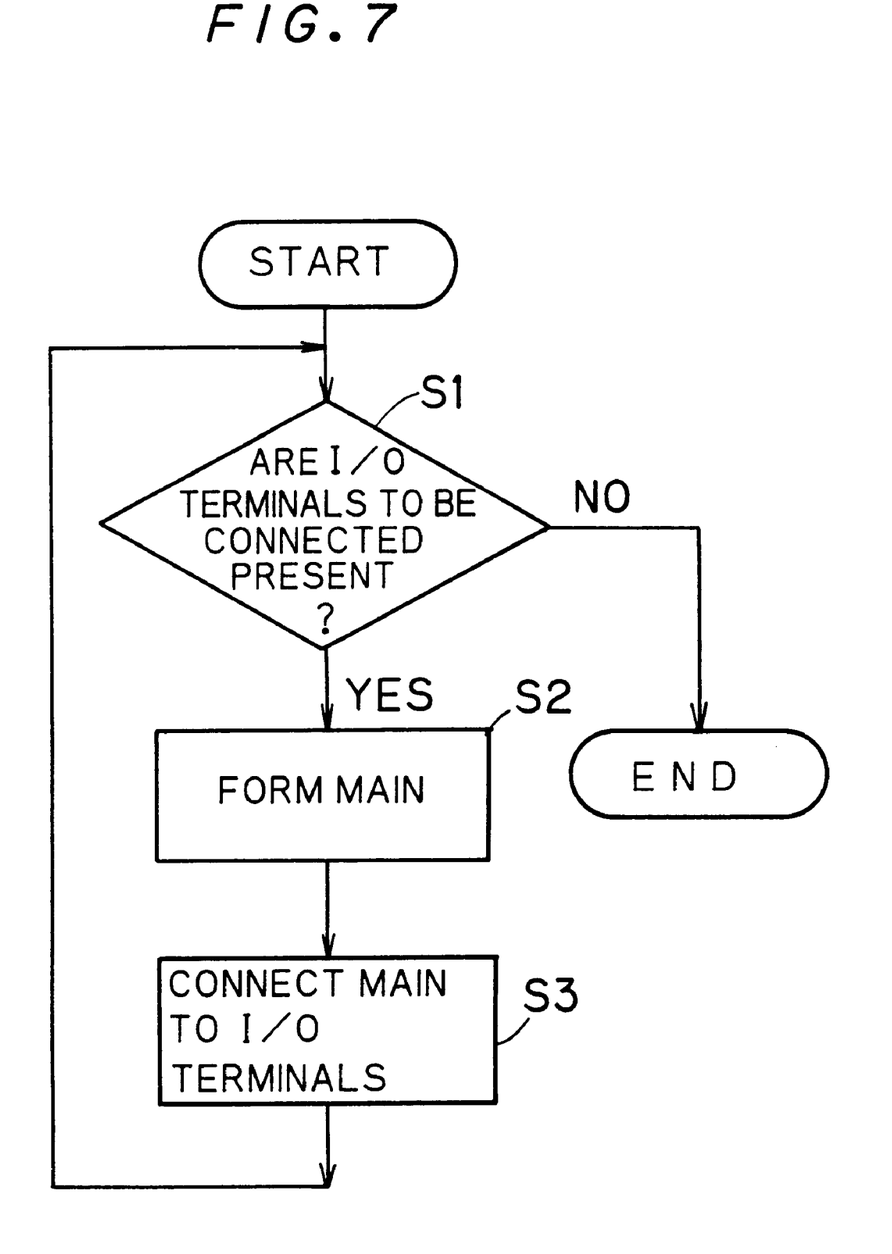
FIG. 7 is a flow chart of a method of wiring the cells in the same cell row according to the second preferred embodiment.

FIG. 7 is a flow chart of a method of wiring the cells in the same cell row according to the second preferred embodiment.

In the process step S1, it is checked if a pair of input/output terminals 10 to be connected are present which are included in different standard cells in the same cell row 30. If not found, the processing is terminated. If found, the processing goes to the process step S2.

In the process step S2, an unused track T is selected. The main 7 is formed on the selected track T between the input/output terminals 10 to be connected.

In the process step S3, the via holes 8 are formed in the regions in which the main 7 formed in the process step S2 overlaps the input/output terminals 10 to be connected two-dimensionally, whereby electrical connection is made between the main 7 and the input/output terminals 10.

The procedure of the process steps S1 to S3 is repeated as far as pairs of input/output terminals to be connected are present, whereby all of the intercell wirings in the same cell row can be made within the standard cells 3.

Thus, the input/output terminals 10 of the respective standard cells 3 and the main 7, which are made of the different aluminium layers, are arranged so that they do not fail to overlap two-dimensionally within the standard cells 3. The via holes 8 are formed in the regions in which the input/output terminals 10 overlap the main 7. This affords the wiring between the standard cells 3 in the same cell row 30, similarly to the first preferred embodiment. As a result, all of the intercell wirings in the same cell row 30 can be made within the cell row 30. Accordingly, the area of the intercell signal wiring exclusive region 4 provided on the outside of the cells can be reduced to improve the integration degree.

In the second preferred embodiment, the second aluminium wiring layer is not used in regions other than the power source wire 1 on the top and the grounding wire 2 on the bottom. The mains made of the second aluminium wiring layer can be advantageously formed in arbitrary positions between the power source wire 1 and the grounding wire 2.

Figure 8:
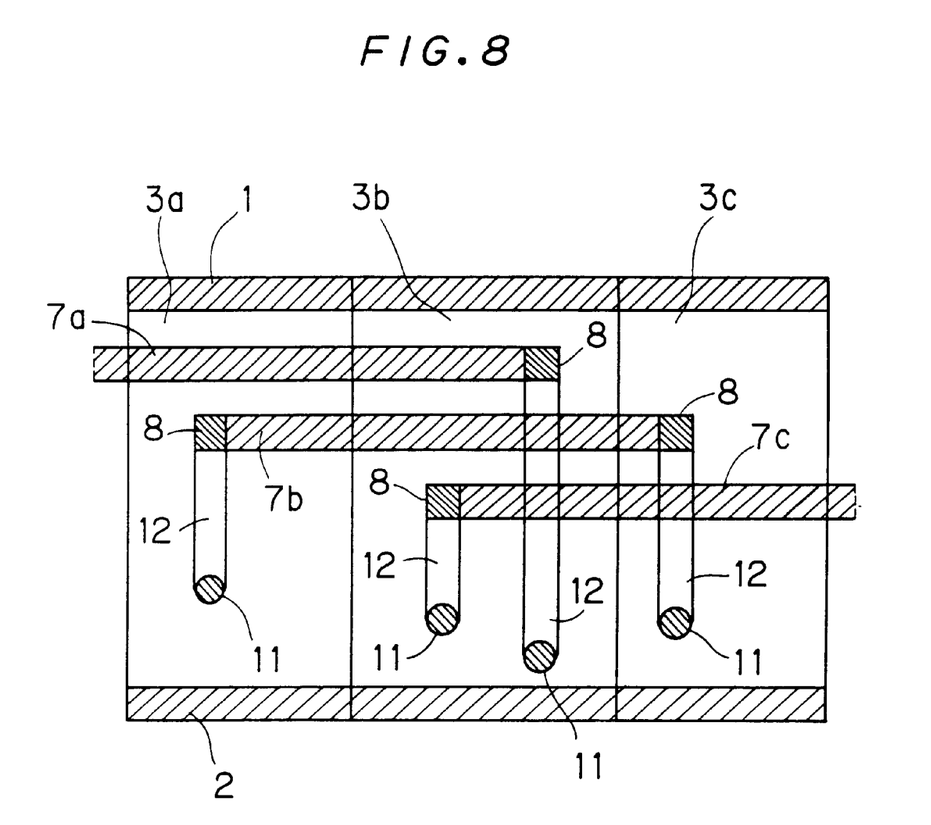
FIG. 8 typically illustrates intercell connection in the same cell row in the semiconductor integrated circuit device in the standard cell system according to a third preferred embodiment of the present invention.

FIG. 8 typically illustrates intercell connection in the same cell row in the semiconductor integrated circuit device in accordance with the standard cell system according to a third preferred embodiment of the present invention. Within the respective cells 3a to 3c in the same cell row, input/output terminals 11 made of the first aluminium wiring layer are electrically connected to branch lines 12 as auxiliary wiring layers made of the first aluminium wiring layer. The branch lines 12 extend perpendicularly to the cell row extending direction from the vicinity of the power source wire 1 to the vicinity of the grounding wire 2. Similarly to the second preferred embodiment, a plurality of mains 7a to 7c made of the second aluminium wiring layer are arranged so that they extend in parallel with the cell row extending direction between the input/output terminals to be connected. The power source wire 1 and the grounding wire 2 are also formed of the second aluminium wiring layer.

The third preferred embodiment is different from the second preferred embodiment in that each of the input/output terminals 11 has the smallest needed region and in that electrical connection between the main 7 and the input/output terminals 11 is made through the branch lines 12 and the via holes 8.

In FIG. 8, for example, the branch line 12 electrically connected to the input/output terminal 11 of the standard cell 3a is electrically connected to the branch line 12 electrically connected to the input/output terminal 11 of the standard cell 3c through the main 7b and the via holes 8, whereby the intercell connection can be made between the standard cells 3a and 3c.

Figure 9:
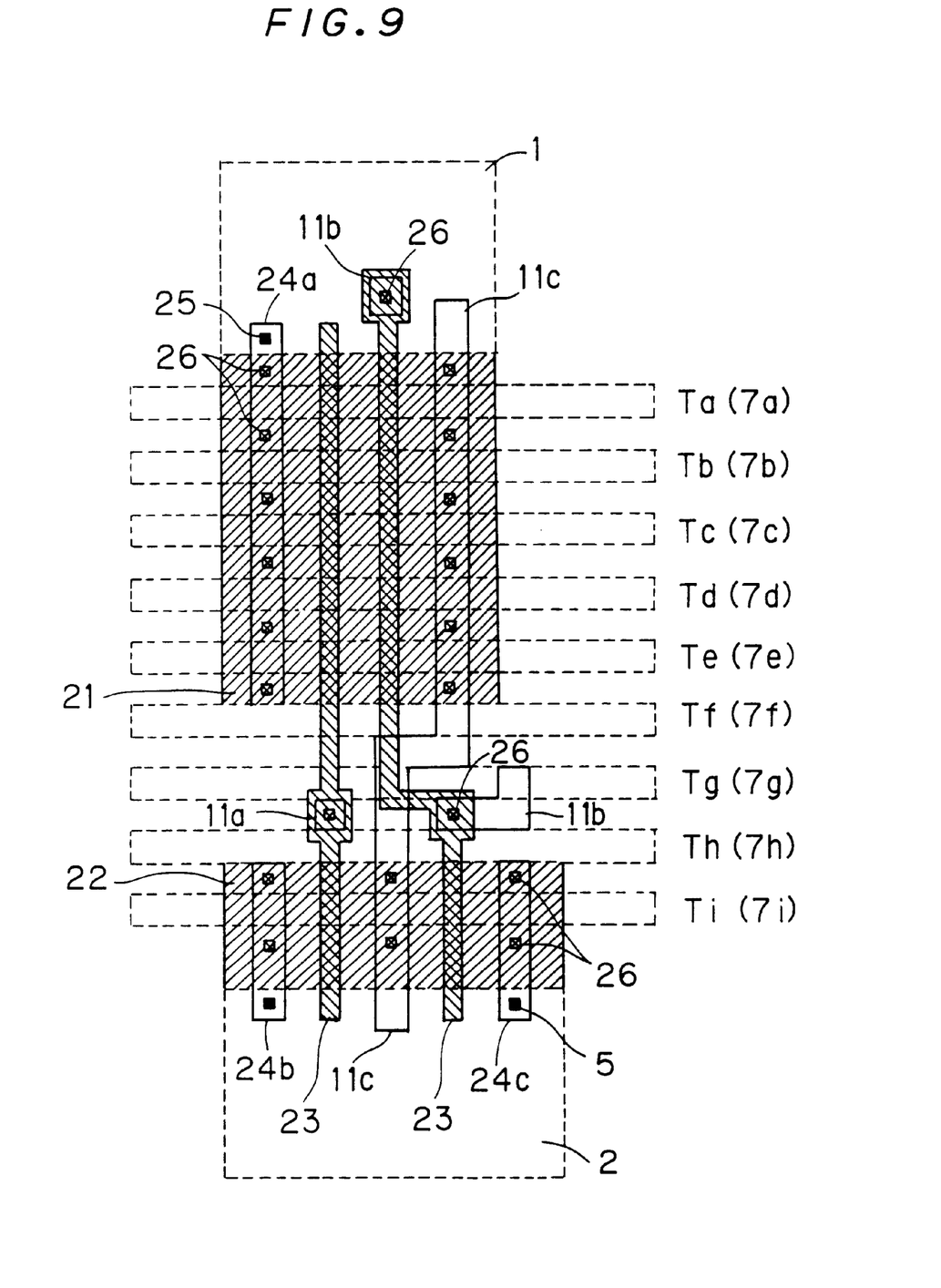
FIGS. 9 and 10 are plan views showing the internal structure of the standard cell in detail according to the third preferred embodiment, respectively.
Figure 10:
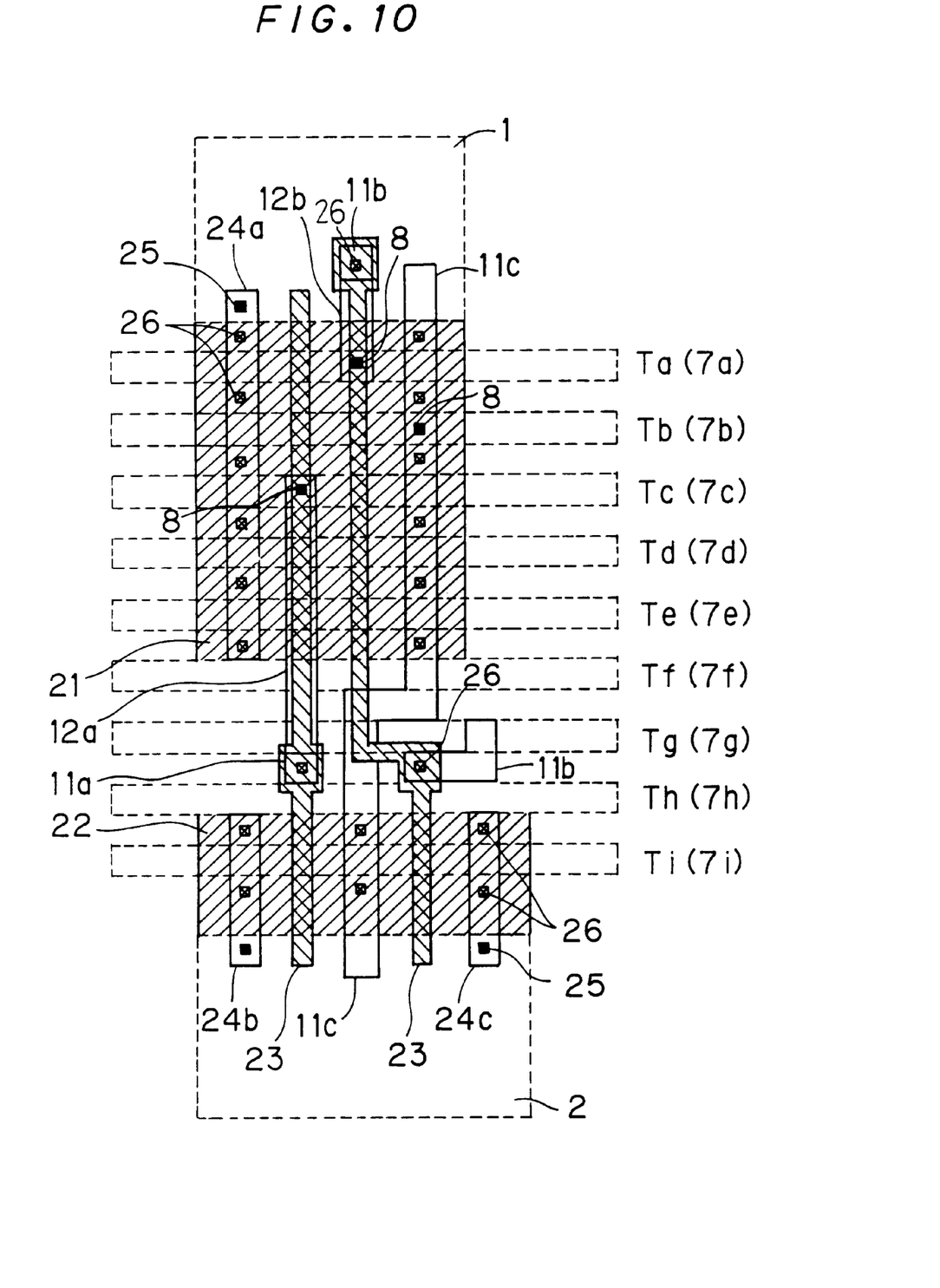

FIGS. 9 and 10 are plan views showing the internal structure of the standard cell 3 in detail according to the third preferred embodiment. FIG. 9 shows the standard cell 3 before intercell wiring, and FIG. 10 shows the standard cell 3 after intercell wiring. As shown in FIG. 9, the polysilicon layers 23 which are different from the first and second aluminium wiring layers are formed above the P and N diffusion regions 21 and 22 provided between the power source and grounding wires 1 and 2 made of the second aluminium wiring layer, so that two P channel transistors and two N channel transistors are formed, similarly to the second preferred embodiment.

Three input/output terminals 11a to 11c made of the first aluminium wiring layer and each having the smallest needed area are formed. The input/output terminal 11b is separated into two portions. The two portions are electrically connected to each other through the polysilicon layers 23 and the via holes 26.

The internal wiring layers 24a to 24c made of the first aluminium wiring layer and the via holes 25 are formed to make electrical connection between the power source wire 1 and the internal wiring layer 24a and electrical connection between the grounding wire 2 and the internal wiring layers 24b, 24c. The provision of the via holes 26 permits electrical connection to be made between the input/output terminals 11a to 11c or the internal wiring layers 24a to 24c and the diffusion regions 21, 22 or the polysilicon layers 23. The two-input NOR gate is structured in which the input/output terminals 11a and 11b are input terminals A and B respectively and the input/output terminal 11c is an output terminal Y, as shown in the equivalent circuit of FIG. 3.

In relation to the standard cell 3 having such a structure, a plurality of tracks Ta to Ti are assumed in parallel between the power source wire 1 and the grounding wire 2. The tracks Ta to Ti are the virtual regions on which the mains 7a to 7i made of the second aluminium wiring layer can be formed. As shown in FIG. 10, the branch lines 12a and 12b are extended from the input/output terminals 11a and 11b so that the branch lines 12a and 12b two-dimensionally overlap the tracks T to which the branch lines are desired to be electrically connected.

Subsequently, the tracks Ta to Tc are selected for electrical connection to the input/output terminals 11a to 11c. The mains 7a to 7c are formed on the tracks Ta to Tc. The via holes 8 are formed in the regions in which the branch line 12a, the branch line 12b and the input/output terminal 11c two-dimensionally overlap the main 7c, the main 7a and the main 7b, respectively, whereby electrical connection can be made between the input/output terminals 11 of the standard cell 3 and the mains 7 formed on the tracks T. That is, electrical connection is made between the input/output terminal 10a and the main 7c through the via hole 8 and the branch line 12a. Electrical connection is made between the input/output terminal 11b and the main 7a through the via hole 8 and the branch line 12b. Electrical connection is made between the input/output terminal 11c and the main 7a through the via hole 8.

The procedure of the method of wiring the cells in the same cell row in the third preferred embodiment is different from that in the second preferred embodiment. The process step S2 and the successive process steps in the flow chart of the second preferred embodiment shown in FIG. 7 are replaced with the following process steps in the third preferred embodiment.

Initially, an unused track T is selected. The branch lines 12 are extended from the pair of input/output terminals 11 to be connected to the regions in which the branch lines 12 overlap the selected track T two-dimensionally. The main 7 is formed on the selected track T. The via holes 8 are made in the regions in which the main 7 overlaps the branch lines 12 two-dimensionally to make electrical connection between the main 7 and the input/output terminals 11 to be connected.

In the third preferred embodiment, the input/output terminal 11 formed of the first aluminium wiring layer in the standard cell 3 has the minimum needed region, while the branch line 12 made of the first aluminium wiring layer is provided in the region required for connection to the main 7. In addition to the same effect as the second preferred embodiment, the third preferred embodiment has an effect that the area of the first aluminium wiring layer can be reduced as compared with the second preferred embodiment.

Figure 11:
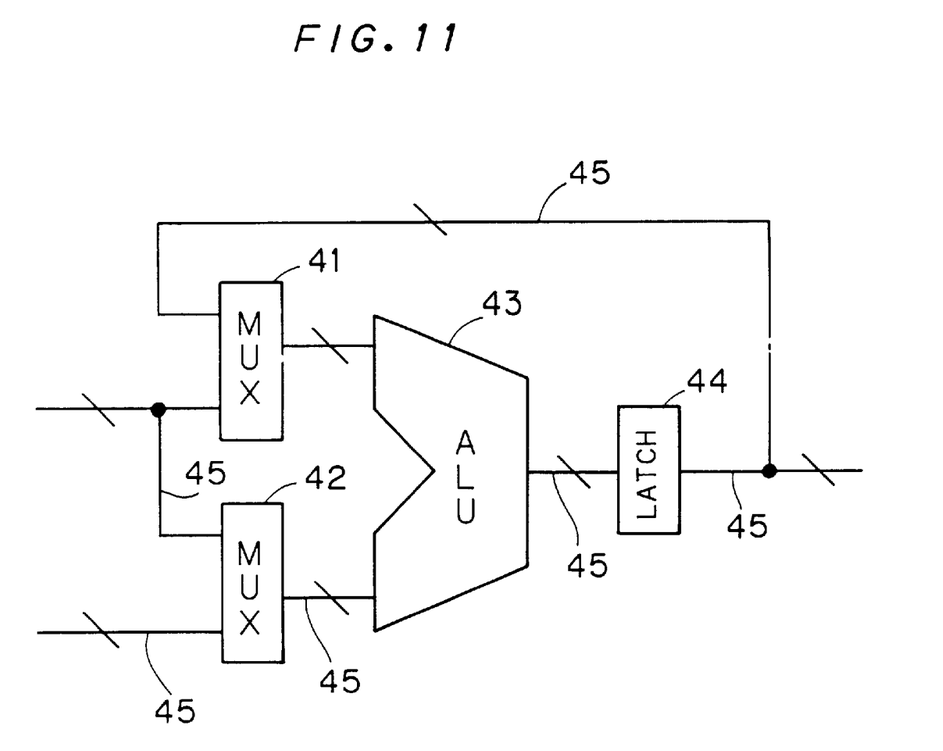
FIG. 11 is a block diagram of an example of a data path circuit.

FIG. 11 is a block diagram of an example of a data path circuit. The data path circuit is an arithmetic operation execution portion in a processor. It is formed by the interconnection of a plurality of circuit blocks (hereinafter referred to as functional blocks) having the function of processing plural-bit wide data.

Reference numerals 41, 42 designate multiplexers, 43 designates an ALU, 44 designates a latch, and 45 designates a 4-bit wide bus for connecting the respective functional blocks 41 to 44. The functional blocks 41 to 44 perform a series of processings by transmitting a 4-bit data from the multiplexers 41, 42 through the data bus 45 to the latch 44.

The data path circuit shown in FIG. 11 has a regular data structure in which respective bits are serially arranged in sequential order from the least significant bit to the most significant bit. The application of the present invention to the formation of the respective functional blocks 41 to 44 by the standard cells in the same cell row enables the data path circuit to be formed without the intercell signal wiring exclusive region 4.

In the first to third preferred embodiments, the input/output terminals 10, 11 and the branch lines 12 are made of the first aluminium wiring layer, while the mains 7 are made of the second aluminium wiring layer. However, the present invention is not limited to this. The first and second aluminium wiring layers may be reversed. Three or more aluminium wiring layers may be employed. In the preferred embodiments, the polysilicon layers serve as the input lines of the P and N channel transistors, and the aluminium layers serve as the output lines thereof. The layers forming the input and output lines are not restricted to these layers.

The devices which constitute the standard cells 3 are CMOSs in the preferred embodiments. The devices are not limited to the CMOSs. Bipolar devices such as ECLs and other MOS devices are similarly effective.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit device comprising:
   a plurality of cell rows, each cell row comprising a plurality of standard cells each having a logical function and including an input/output terminal;
   a plurality of intercell row regions formed between each two adjacent cell rows;
   an intercell signal wiring formed in the plurality of intercell row regions for connecting different standard cells in different cell rows together;
   a cell row wiring for connecting different input/output terminals of standard cells in the same cell row together, the cell row wiring being formed on an active region in the same cell row,
   wherein the cell row wiring is configured to connect all of different input/output terminals of standard cells in a same cell row together.

2. The semiconductor integrated circuit device according to claim 1, wherein the cell row wiring overlaps the input/output terminals of the standard cells to be connected together.

3. The semiconductor integrated circuit according to claim 2, wherein
   the input/output terminal is formed of a first layer, and
   the row wiring is formed of a second layer which overlaps two-dimensionally with the first layer.

4. The semiconductor integrated circuit according to claim 3, wherein
   said active region includes a forming region of a MOS transistor, and
   said first layer, being isolated from a gate electrode layer of said MOS transistor, is configured to connect said gate electrode layer by forming a via hole in a region which overlaps with said gate electrode layer.

5. The semiconductor integrated circuit according to claim 2, further comprising via holes where the cell row wiring overlaps the input/output terminals of the standard cells to be connected together, so that the cell row wiring contacts the input/output terminals of the standard cells to be connected together at the via holes.

6. The semiconductor integrated circuit according to claim 5, wherein the input/output terminal is formed of a first layer, and the row wiring is formed of a second layer which overlaps two-dimensionally with the first layer.

7. The semiconductor integrated circuit according to claim 6, said active region includes a forming region of a MOS transistor, and said first layer, being isolated from a gate electrode layer of said MOS transistor, is configured to connect said gate electrode layer by forming a via hole in a region which overlaps with said gate electrode layer.

8. The semiconductor integrated circuit according to claim 1, wherein the input/output terminal is formed of a first layer, and the row wiring is formed of a second layer which overlaps two-dimensionally with the first layer.

9. The semiconductor integrated circuit according to claim 8, wherein said active region includes a forming region of a MOS transistor, and said first layer, being isolated from a gate electrode layer of said MOS transistor, is configured to connect said gate electrode layer by forming a via hole in a region which overlaps with said gate electrode layer.

* * * * *